United States Patent
Okami (10) Patent No.: US 10,752,985 B2
(45) Date of Patent: Aug. 25, 2020

(54) LAMINATE FILM AND ELECTRODE SUBSTRATE FILM, AND METHOD OF MANUFACTURING THE SAME

(71) Applicant: SUMITOMO METAL MINING CO., LTD., Tokyo (JP)

(72) Inventor: Hideharu Okami, Niihama (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 288 days.

(21) Appl. No.: 15/515,370

(22) PCT Filed: Oct. 19, 2015

(86) PCT No.: PCT/JP2015/079407
§ 371 (c)(1),
(2) Date: Mar. 29, 2017

(87) PCT Pub. No.: WO2016/067943
PCT Pub. Date: May 6, 2016

(65) Prior Publication Data
US 2017/0226624 A1  Aug. 10, 2017

(30) Foreign Application Priority Data
Oct. 29, 2014  (JP) .................................. 2014-220331

(51) Int. Cl.
*H05K 3/46*  (2006.01)
*H05K 3/06*  (2006.01)
(Continued)

(52) U.S. Cl.
CPC .......... *C23C 14/0089* (2013.01); *B32B 15/08* (2013.01); *C23C 14/0015* (2013.01);
(Continued)

(58) Field of Classification Search
None
See application file for complete search history.

(56) References Cited

U.S. PATENT DOCUMENTS

2009/0291293 A1* 11/2009 Sakakura ............ H01L 51/0097
428/323
2009/0311498 A1* 12/2009 Kiyomura ........... C23C 16/0272
428/218
(Continued)

FOREIGN PATENT DOCUMENTS

JP   2003-132737 A1   5/2003
JP   2003-151358 A1   5/2003
(Continued)

OTHER PUBLICATIONS

Abe; "Utilization of Water Vapor for Sputter Deposition of Thin Films;" J. Vac. Soc. Jpn.; vol. 53; No. 9; 2010; pp. 515-520 (6 Sheets)/p. 6 of specification.
(Continued)

*Primary Examiner* — Stephanie P Duclair
(74) *Attorney, Agent, or Firm* — Kratz, Quintos & Hanson, LLP (57) ABSTRACT

[Object] Provided are a laminate film and an electrode substrate film with excellent etching quality, in which a circuit pattern formed by etching processing is less visible under highly bright illumination, and a method of manufacturing the same.
[Solving Means] A laminate film includes a transparent substrate 60 formed of a resin film and a layered film provided on at least one surface of the transparent substrate. The layered film includes metal absorption layers 61 and 63 as a first layer and metal layers (62, 65), (64, 66) as a second layer, counted from the transparent substrate side. The metal absorption layers are formed by a reactive sputtering method which uses a metal target made of Ni alone or an alloy
(Continued)

containing two or more elements selected from Ni, Ti, Al, V, W, Ta, Si, Cr, Ag, Mo, and Cu, and a reactive gas containing oxygen. The reactive gas contains hydrogen.

10 Claims, 5 Drawing Sheets (51) Int. Cl.
| | |
|---|---|
| H05K 1/09 | (2006.01) |
| H05K 1/02 | (2006.01) |
| H01L 23/373 | (2006.01) |
| H01L 21/3065 | (2006.01) |
| H01L 21/306 | (2006.01) |
| H01L 21/263 | (2006.01) |
| H01L 21/02 | (2006.01) |
| G06F 3/044 | (2006.01) |
| C23C 14/58 | (2006.01) |
| C23C 14/56 | (2006.01) |
| C23C 14/54 | (2006.01) |
| C23C 14/20 | (2006.01) |
| C23C 14/08 | (2006.01) |
| C23C 14/06 | (2006.01) |
| C23C 14/00 | (2006.01) |
| B32B 15/08 | (2006.01) |

(52) U.S. Cl.
CPC .......... *C23C 14/0057* (2013.01); *C23C 14/06* (2013.01); *C23C 14/085* (2013.01); *C23C 14/205* (2013.01); *C23C 14/548* (2013.01); *C23C 14/562* (2013.01); *C23C 14/5873* (2013.01); *G06F 3/044* (2013.01); *H01L 21/02296* (2013.01); *H01L 21/2633* (2013.01); *H01L 21/306* (2013.01); *H01L 21/3065* (2013.01); *H01L 21/30604* (2013.01); *H01L 23/3735* (2013.01); *H05K 1/0274* (2013.01); *H05K 1/09* (2013.01); *H05K 3/06* (2013.01); *H05K 3/064* (2013.01); *H05K 3/467* (2013.01); *G06F 2203/04103* (2013.01); *G06F 2203/04112* (2013.01); *H05K 2201/0108* (2013.01); *H05K 2201/0338* (2013.01); *H05K 2201/0373* (2013.01); *H05K 2201/09681* (2013.01); *H05K 2201/10128* (2013.01); *H05K 2203/087* (2013.01)

(56) References Cited

U.S. PATENT DOCUMENTS

| | | | | |
|---|---|---|---|---|
| 2010/0035034 | A1* | 2/2010 | Yin | ..................... C23C 14/0676 |
| | | | | 428/216 |
| 2013/0215067 | A1* | 8/2013 | Hwang | .................. G02B 5/003 |
| | | | | 345/173 |
| 2015/0184278 | A1 | 7/2015 | Reichert | |

FOREIGN PATENT DOCUMENTS

| | | | | |
|---|---|---|---|---|
| JP | 2006336084 | * | 12/2006 | ............. C23C 14/34 |
| JP | 2007-039781 A1 | | 2/2007 | |
| JP | 2011-018194 A1 | | 1/2011 | |
| JP | 2013-001993 A1 | | 1/2013 | |
| JP | 2013-069261 A1 | | 4/2013 | |
| JP | 2013-225276 A1 | | 10/2013 | |
| JP | 2014-142462 A1 | | 8/2014 | |
| WO | 2013178613 A1 | | 12/2013 | |

OTHER PUBLICATIONS

International Search Report for International Application No. PCT/JP2015/079407 dated Jan. 12, 2016.

* cited by examiner

LAMINATE FILM AND ELECTRODE SUBSTRATE FILM, AND METHOD OF MANUFACTURING THE SAME

TECHNICAL FIELD

The present invention relates to a laminate film which includes a transparent substrate formed of a resin film and a layered film, and an electrode substrate film which is manufactured by etching the layered film of the laminate film and is applied to a touch panel or the like, and particularly to a laminate film, an electrode substrate film with excellent etching quality, in which a circuit pattern formed by etching is less visible even under highly bright illumination, and a method of manufacturing the same.

BACKGROUND ART

In late years, "touch panels" have come to be widely used which are installed on surfaces of flat panel displays (FPD) included in a mobile phone, a portable device for electronic documents, a vending machine, a car navigation system, and the like.

The "touch panels" described above are largely divided into resistive ones and capacitive ones. The "resistive touch panel" has a main part which includes a transparent substrate formed of a resin film, an X-coordinate- (or Y-coordinate-) detecting electrode sheet and a Y-coordinate- (or X-coordinate-) detecting electrode sheet provided on the substrate, and an insulating spacer provided between these sheets. Here, although the X-coordinate-detecting electrode sheet and the Y-coordinate-detecting electrode sheet described above are spatially separated, both coordinate-detecting electrode sheets are configured to come into electrical contact with each other when pressed by a pen or the like, and to detect the position (X-coordinate and Y-coordinate) which the pen touched. The sheets are designed to trace the movement of the pen and recognize its coordinates, making it possible for the character to be inputted as a result. On the other hand, the "capacitive touch panel" has a structure where an X-coordinate- (or Y-coordinate-) detecting electrode sheet and a Y-coordinate- (or X-coordinate-) detecting electrode sheet are laminated with an insulating sheet in between, and an insulator such as glass is dispose on these. With this setup, when a finger approaches the above-described insulator such as glass, the sheets detect the position because electric capacitances of the X-coordinate-detecting electrode and the Y-coordinate-detecting electrode change.

Conventionally, transparent conductive films formed of ITO (indium oxide-tin oxide) and the like have been widely used as a conductive material for a circuit pattern of electrodes and the like (see Patent Document 1). Along with an increase in size of touch panels, mesh-structure metal thin lines (metal films) as disclosed in Patent Document 2, Patent Document 3, and the like are beginning to be used.

Comparison between the transparent conductive film and the metal thin line (metal film) described above shows the transparent conductive film has an advantage that, due to its excellent transmittance in a visible wavelength range, the circuit pattern of electrodes and the like is less visible, but the transparent conductive film has a disadvantage that it is unsuitable for the purpose of increasing the size and response speed of touch panels because its electrical resistance value is higher than that of the metal thin line (metal film). The metal thin line (metal film), on the other hand, is suitable for the purpose of increasing the size and response speed of touch panels because of its low electrical resistance value, but has a disadvantage that, due to a high reflectance in the visible wavelength range, the circuit pattern may be visible under highly bright illumination even if the metal thin line is formed into a fine mesh structure, which results in a decrease in product value.

In view of the above, in order to take advantage of the characteristic of the above-mentioned metal thin line (metal film) having a low electrical resistance value, a method is proposed that includes interposing a metal absorption layer (referred to as a blackened film) made of metal oxide between a transparent substrate formed of a resin film and a metal thin line (metal film) (see Patent Document 4 and Patent Document 5), and thereby reducing reflection on the metal thin line (metal film) observed on the transparent substrate side.

Moreover, from the standpoint of achieving efficient deposition of the metal oxide, the above-described metal absorption layer made of metal oxide is usually deposited continuously on a surface of a long resin film by, for example, reactive sputtering which uses a metal target (metal material) and a reactive gas, and a metal layer is continuously deposited on the metal absorption layer thus deposited by, for example, sputtering which uses a metal target (metal material) such as copper. In such a manner, a laminate film used in the fabrication of an electrode substrate film is manufactured.

Here, the electrode substrate film applied to a touch panel or the like is manufactured by: etching a layered film included in a laminate film using an etching liquid such as an aqueous solution of copper(II) chloride or an aqueous solution of ferric chloride, the laminate film including a transparent substrate formed of a resin film and the layered film formed of a metal absorption layer provided on the substrate and of a metal layer; and forming a circuit pattern of electrodes and the like from the layered film (metal absorption layer and metal layer) of the laminate film.

For this reason, the laminate film used in the fabrication of the electrode substrate film is required to have such characteristics that the layered film (metal absorption layer and metal layer) is easily etched by an etching liquid such as an aqueous solution of copper(II) chloride or an aqueous solution of ferric chloride, and that the circuit pattern of electrodes and the like formed by etching processing is less visible under highly bright illumination.

CONVENTIONAL ART DOCUMENTS

Patent Documents

Patent Document 1: Japanese Patent Application Publication No. 2003-151358 (see claim 2)

Patent Document 2: Japanese Patent Application Publication No. 2011-018194 (see claim 1)

Patent Document 3: Japanese Patent Application Publication No. 2013-069261 (see paragraph 0004)

Patent Document 4: Japanese Patent Application Publication No. 2014-142462 (see claim 5 and paragraph 0038)

Patent Document 5: Japanese Patent Application Publication No. 2013-225276 (see claim 1 and paragraph 0041)

Non-Patent Document

Non-Patent Document 1: J. Vac. Soc. Jpn. Vol. 53, No. 9, (2010), p 515-520

SUMMARY OF THE INVENTION

Problem to be Solved by the Invention

However, there is a problem as described below in the fabrication of an electrode substrate film using a laminate film which is manufactured by: continuously depositing a metal absorption layer made of metal oxide on a surface of a long resin film by, for example, reactive sputtering which uses a metal target (metal material) of a Ni-based alloy or the like and a reactive gas containing oxygen; and continuously depositing a metal layer on this metal absorption layer by, for example, sputtering which uses a metal target (metal material) such as copper.

To be more specific, the problem is that, when the electrode substrate film is fabricated by etching the layered film (metal absorption layer and metal layer) of the laminate film, the laminate film on the later-deposited end side (region of the long laminate film on the later-deposited end side), where the metal absorption layer is formed in the later stages of deposition, is inferior in terms of etching quality to the laminate film on the earlier-deposited end side (region of the long laminate film on the earlier-deposited end side), where the metal absorption layer is formed in the early stages of deposition. This results in a problem of unstable processing precision of the circuit pattern in the electrode substrate film.

The present invention has been made in view of such a problem, and an object thereof is to provide a laminate film and an electrode substrate film with excellent etching quality, in which a circuit pattern of electrodes and the like formed by etching processing is less visible even under highly bright illumination, and at the same time to provide a method of manufacturing each of the laminate film and the electrode substrate film.

Means for Solving the Problems

Given the above situation, the present inventor investigated the reason for which the etching quality of the laminate film on the later-deposited end side is inferior to that of the laminate film on the earlier-deposited end side, and studied its improvement measures.

First, examination of the etching quality of the metal absorption layer and the metal layer constituting the layered film of the laminate film revealed that it is difficult to etch, using an etching liquid such as an aqueous solution of copper(II) chloride or an aqueous solution of ferric chloride, the metal absorption layer which is formed by, for example, reactive sputtering which uses a metal target (metal material) of a Ni-based alloy or the like and a reactive gas containing oxygen, compared to the metal layer which is formed by, for example, sputtering which uses a metal target (metal material) such as copper or the like. This led to a prediction that the metal absorption layer made of metal oxide, out of the metal absorption layer and the metal layer constituting the layered film of the laminate film, is in relation to whether the etching quality of the laminate film on the later-deposited end side is good or poor. With this taken into consideration, the present inventor consulted the literature on the chemical composition of the metal oxide (metal absorption layer) deposited by, for example, reactive sputtering which uses a metal target (metal material) of a Ni-based alloy or the like and found a description of Non-Patent Document 1, according to which the metal oxide converts to a NiO film when oxygen as a reactive gas is introduced in a vacuum chamber, and the metal oxide converts to a NiOOH film when water as a reactive gas is introduced in a vacuum chamber, in reactive sputtering which uses a Ni-based metal target (metal material).

Based on the description of Non-Patent Document 1, a Ni-film was deposited by sputtering which used a Ni-based metal target (metal material), and in addition, a NiOOH film and a NiO film were deposited by reactive sputtering which used a Ni-based metal target (metal material) to examine the etching quality for an etching liquid such as an aqueous solution of copper(II) chloride or an aqueous solution of ferric chloride. The results showed that etching proceeded in the order of decreasing etching rate: Ni-film, NiOOH film, and NiO film. This led to an estimation that in the laminate film on the earlier-deposited end side, part of the metal oxide deposited was a NiOOH film (Ni-film, which has a better etching quality than the NiOOH film, is not the metal oxide and thus does not fall within the metal absorption layer) which is easily etched, while in the laminate film on the later-deposited end side, most part of the metal oxide deposited was a NiO film (which is difficult to etch compared to a NiOOH film). This is probably caused by the change over time of the deposition environment (change over time of residual water in the vacuum chamber) in the formation of the metal oxide (metal absorption layer) by the above-described reactive sputtering or the like.

Under such a technical consideration, the change over time in the amount of water in the vacuum chamber was measured with a quadrupole mass analyzer, which showed that in the later stages of the deposition of the metal oxide (metal absorption layer), the amount of water in the vacuum chamber significantly reduced compared to that in the early stages of deposition, as illustrated in the graph diagram of FIG. 7.

Furthermore, it was also found that the etching quality of the laminate film on the later-deposited end side deteriorated compared to the laminate film on the earlier-deposited end side as the amount of water in the vacuum chamber reduced even in the case where another alloy target, containing two or more elements selected from Ti, Cu, Al, V, W, Ta, and the like, was applied instead of a Ni-based target such as the Ni-based alloy described above.

The present invention has been completed as a result of such investigation and technical analysis. In the formation of a metal oxide (metal absorption layer) by, for example, reactive sputtering which uses a metal target (metal material) of a Ni-based alloy or the like and a reactive gas containing oxygen, the etching quality of the layered film in the laminate film is improved by depositing the metal oxide (metal absorption layer) while supplying hydrogen into the above-described reactive gas to compensate for the decrease in the amount of water in the vacuum chamber.

In summary, a first aspect of the present invention is a laminate film including a transparent substrate formed of a resin film and a layered film provided on at least one surface of the transparent substrate, characterized in that the layered film includes a metal absorption layer as a first layer and a metal layer as a second layer, counted from the transparent substrate side, the metal absorption layer is formed by a reactive deposition method which uses a metal material made of Ni alone or an alloy containing two or more elements selected from Ni, Ti, Al, V, W, Ta, Si, Cr, Ag, Mo, and Cu, and a reactive gas containing oxygen, and the reactive gas contains hydrogen.

A second aspect of the invention is the laminate film described in the first aspect, characterized in that a film thickness of the metal layer ranges from 50 nm to 5000 nm inclusive.

A third aspect of the invention is
the laminate film described in the first aspect, characterized in that
the layered film includes a second metal absorption layer as a third layer, counted from the transparent substrate side, and the second metal absorption layer is formed by the reactive deposition method which uses a metal material made of Ni alone or an alloy containing two or more elements selected from Ni, Ti, Al, V, W, Ta, Si, Cr, Ag, Mo, and Cu, and a reactive gas containing oxygen, and
the reactive gas contains hydrogen.

In addition, a fourth aspect of the invention is
the laminate film described in the first aspect or the third aspect, characterized in that
the alloy includes a Ni-based alloy containing one or more elements selected from Ti, Al, V, W, Ta, Si, Cr, Ag, Mo, and Cu.

Next, a fifth aspect of the present invention is
an electrode substrate film including a transparent substrate formed of a resin film and a mesh circuit pattern provided on at least one surface of the transparent substrate and formed of a metal laminate thin line, characterized in that
the metal laminate thin line has a line width of 20 µm or less and includes a metal absorption layer as a first layer and a metal layer as a second layer, counted from the transparent substrate side,
the metal absorption layer is formed by a reactive deposition method which uses a metal material made of Ni alone or an alloy containing two or more elements selected from Ni, Ti, Al, V, W, Ta, Si, Cr, Ag, Mo, and Cu, and a reactive gas containing oxygen, and
the reactive gas contains hydrogen.

A sixth aspect of the invention is
the electrode substrate film described in the fifth aspect, characterized in that
a film thickness of the metal layer ranges from 50 nm to 5000 nm inclusive.

A seventh aspect of the invention is
the electrode substrate film described in the fifth aspect, characterized in that
the metal laminate thin line includes a second metal absorption layer as a third layer, counted from the transparent substrate side, and the second metal absorption layer is formed by the reactive deposition method which uses a metal material made of Ni alone or an alloy containing two or more elements selected from Ni, Ti, Al, V, W, Ta, Si, Cr, Ag, Mo, and Cu, and a reactive gas containing oxygen, and
the reactive gas contains hydrogen.

Moreover, an eighth aspect of the invention is
the electrode substrate film described in the fifth aspect or the seventh aspect, characterized in that
the alloy includes a Ni-based alloy containing one or more elements selected from Ti, Al, V, W, Ta, Si, Cr, Ag, Mo, and Cu.

Next, a ninth aspect of the present invention is
a method of manufacturing a laminate film which includes a transparent substrate formed of a resin film and a layered film provided on at least one surface of the transparent substrate, characterized in that the method comprises:
a first step of forming a metal absorption layer as a first layer, counted from the transparent substrate side of the layered film, by a reactive deposition method which uses a metal material made of Ni alone or an alloy containing two or more elements selected from Ni, Ti, Al, V, W, Ta, Si, Cr, Ag, Mo, and Cu, and a reactive gas containing oxygen; and
a second step of forming a metal layer as a second layer, counted from the transparent substrate side of the layered film, by a deposition method which uses a metal material, and
the reactive gas in the first step contains hydrogen.

A tenth aspect of the invention is
the method of manufacturing a laminate film described in the ninth aspect, characterized in that the method further comprises
a third step of forming a second metal absorption layer as a third layer, counted from the transparent substrate side of the layered film, by the reactive deposition method which uses a metal material made of Ni alone or an alloy containing two or more elements selected from Ni, Ti, Al, V, W, Ta, Si, Cr, Ag, Mo, and Cu, and a reactive gas containing oxygen, and
the reactive gas in the third step contains hydrogen.

An eleventh aspect of the invention is
the method of manufacturing a laminate film described in the ninth aspect or the tenth aspect, characterized in that
the alloy includes a Ni-based alloy containing one or more elements selected from Ti, Al, V, W, Ta, Si, Cr, Ag, Mo, and Cu.

A twelfth aspect of the invention is
the method of manufacturing a laminate film described in the ninth aspect or the tenth aspect, characterized in that
the hydrogen contained in the reactive gas is introduced into a deposition chamber such that a hydrogen concentration is high on the transparent substrate side of the metal absorption layer and the second metal absorption layer formed in the first step and the third step.

Furthermore, a thirteenth aspect of the invention is
the method of manufacturing a laminate film described in the ninth aspect or the tenth aspect, characterized in that
the amount of hydrogen contained in the reactive gas is set to an amount which compensates for a decrease in the amount of residual water in a deposition chamber in the first step and the third step.

Next, a fourteenth aspect of the present invention is
a method of manufacturing an electrode substrate film including a transparent substrate formed of a resin film and a mesh circuit pattern provided on at least one surface of the transparent substrate and formed of a metal laminate thin line, characterized in that the method comprises
performing chemical etching on the layered film of the laminate film described in any of the first to third aspects to form the metal laminate thin line with a line width of 20 µm or less.

A fifteenth aspect of the invention is
a method of manufacturing an electrode substrate film including a transparent substrate formed of a resin film and a mesh circuit pattern provided on at least one surface of the transparent substrate and formed of a metal laminate thin line, characterized in that the method includes
performing chemical etching on the layered film of the laminate film described in the fourth aspect to form the metal laminate thin line with a line width of 20 µm or less.

Effects of the Invention

A laminate film according to the present invention, including a transparent substrate formed of a resin film and a layered film provided on at least one surface of the transparent substrate, is characterized in that the layered film includes a metal absorption layer as a first layer and a metal layer as a second layer, counted from the transparent substrate side, the metal absorption layer is formed by a reactive deposition method which uses a metal material made of Ni alone or an alloy containing two or more elements selected from Ni, Ti, Al, V, W, Ta, Si, Cr, Ag, Mo, and Cu, and a reactive gas containing oxygen, and the reactive gas contains hydrogen.

Besides, in the laminate film according to the present invention, a metal oxide (metal absorption layer) of the layered film is deposited while supplying hydrogen into the reactive gas to compensate for the decrease in the amount of water in the vacuum chamber. For this reason, it becomes possible to avoid the problem of deterioration in the etching quality of the laminate film on the later-deposited end side compared to the laminate film on the earlier-deposited end side.

Hence, the present invention has an effect that it can provide a laminate film and an electrode substrate film with excellent etching quality, in which the circuit pattern formed by etching processing is less visible even under highly bright illumination.

MODES FOR PRACTICING THE INVENTION

An embodiment of the present invention is described below in detail with reference to the drawings.

(1) Laminate Film

A first laminate film according to the present invention includes a transparent substrate formed of a resin film and a layered film provided on at least one surface of the transparent substrate, and is characterized in that the layered film includes a metal absorption layer as a first layer and a metal layer as a second layer, counted from the transparent substrate side, the metal absorption layer is formed by a reactive deposition method which uses a metal material made of Ni alone or an alloy containing two or more elements selected from Ni, Ti, Al, V, W, Ta, Si, Cr, Ag, Mo, and Cu, and a reactive gas containing oxygen, and the reactive gas contains hydrogen.

Besides, a second laminate film according to the present invention is premised on the first laminate film, and is characterized in that the layered film includes a second metal absorption layer as a third layer, counted from the transparent substrate side, and the second metal absorption layer is formed by the reactive deposition method which uses a metal material made of Ni alone or an alloy containing two or more elements selected from Ni, Ti, Al, V, W, Ta, Si, Cr, Ag, Mo, and Cu, and a reactive gas containing oxygen, and the reactive gas contains hydrogen.

(1-1) First Laminate Film

Figure 1:
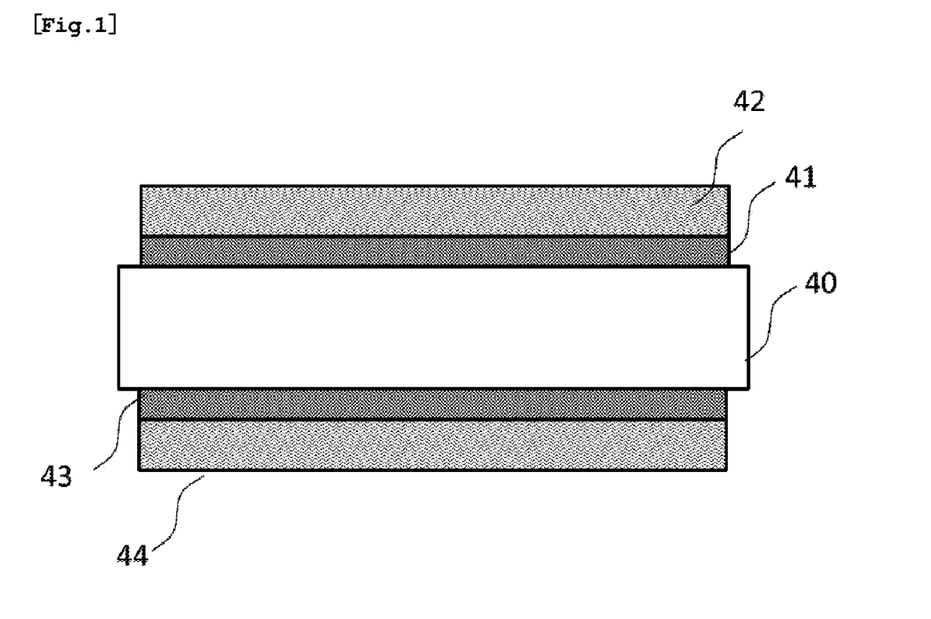
FIG. 1 is a schematic explanatory diagram of a cross-section of a laminate film according to the present invention which includes, on each of both surfaces of a transparent substrate formed of a resin film, a metal absorption layer as a first layer and a metal layer as a second layer counted from the transparent substrate side.

As illustrated in FIG. 1, the first laminate film includes a transparent substrate 40 formed of a resin film and, on both surfaces of the transparent substrate 40, metal absorption layers 41 and 43 and metal layers 42 and 44 formed by a dry deposition method (dry plating method).

Incidentally, the metal layers described above may be formed by a combination of the dry deposition method (dry plating method) and a wet deposition method (wet plating method).

Figure 2:
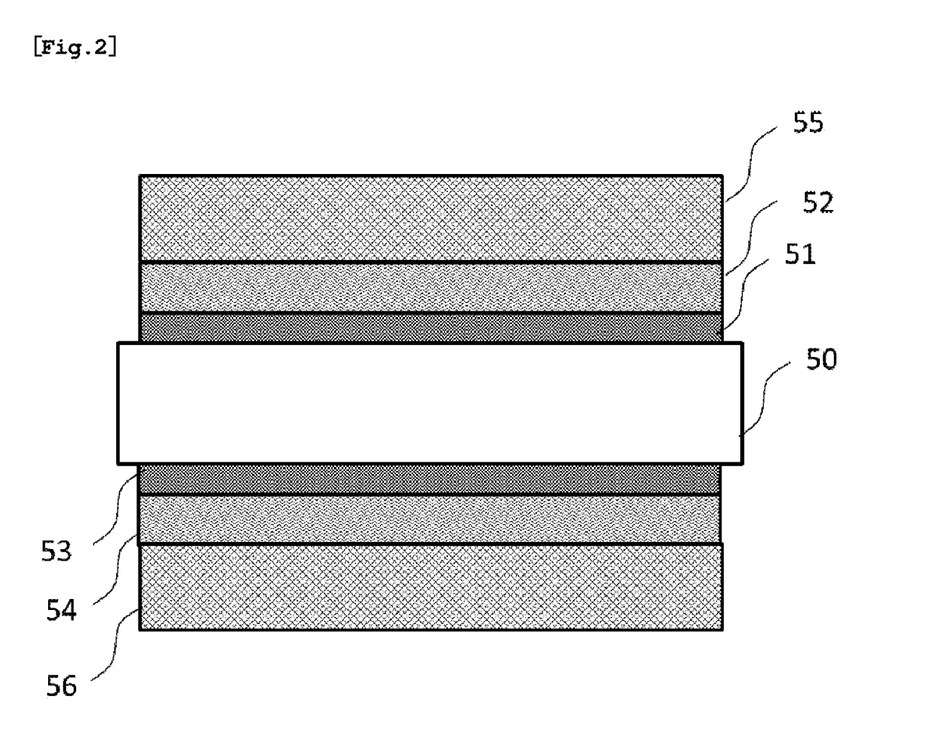
FIG. 2 is a schematic explanatory diagram of a cross-section of the laminate film according to the present invention which includes, on each of both surfaces of the transparent substrate formed of a resin film, a metal absorption layer as a first layer and metal layers as a second layer counted from the transparent substrate side, and the metal layers are formed by a dry deposition method and a wet deposition method.

To be more specific, as illustrated in FIG. 2, the configuration may include a transparent substrate 50 formed of a resin film, metal absorption layers 51 and 53 with a film thickness of 15 nm to 30 nm formed on both surfaces of the transparent substrate 50 by the dry deposition method (dry plating method), metal layers 52 and 54 formed on the metal absorption layers 51 and 53 by the dry deposition method (dry plating method), and metal layers 55 and 56 formed on the metal layers 52 and 54 by the wet deposition method (wet plating method).

(1-2) Second Laminate Film

Next, the second laminate film is premised on the first laminate film illustrated in FIG. 2 and includes second metal absorption layers formed on the metal layers of the laminate film.

Figure 3:
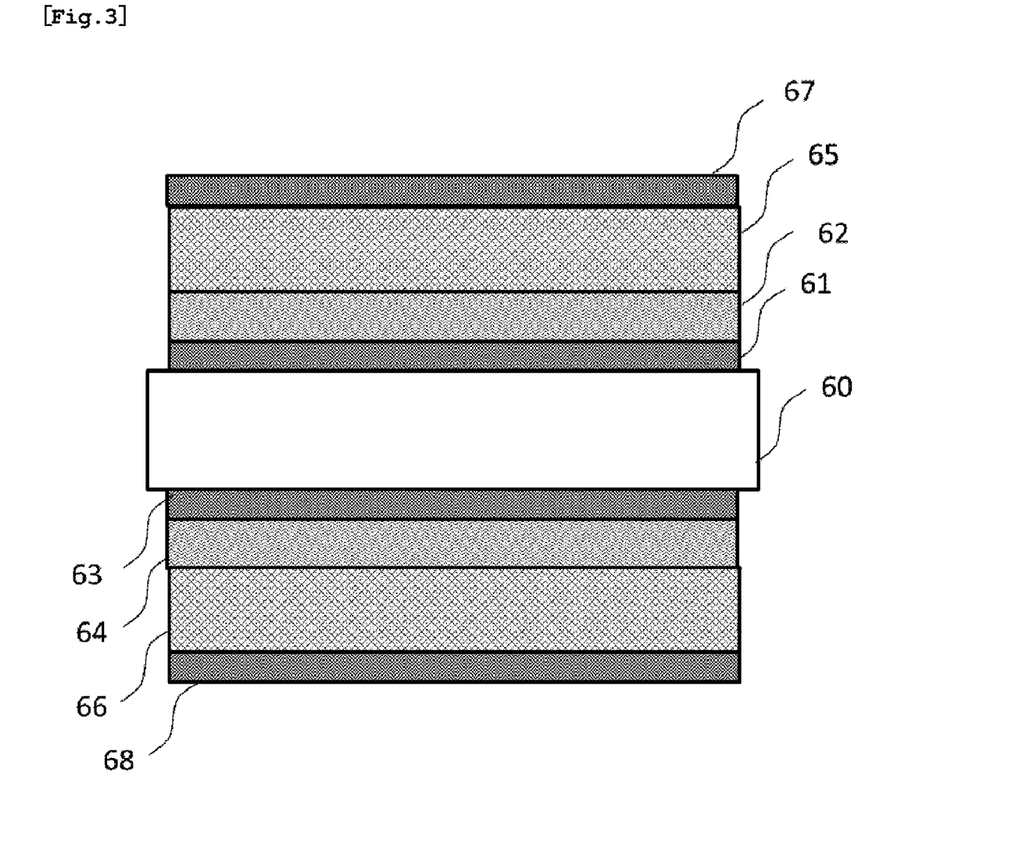
FIG. 3 is a schematic explanatory diagram of a cross-section of the laminate film according to the present invention which includes, on each of both surfaces of the transparent substrate formed of a resin film, a metal absorption layer as a first layer, metal layers as a second layer, and a second metal absorption layer as a third layer counted from the transparent substrate side, and the metal layers are formed by the dry deposition method and the wet deposition method.

To be more precise, as illustrated in FIG. 3, the configuration includes a transparent substrate 60 formed of a resin film, metal absorption layers 61 and 63 with a film thickness of 15 nm to 30 nm formed on both surfaces of the transparent substrate 60 by the dry deposition method (dry plating method), metal layers 62 and 64 formed on the metal absorption layers 61 and 63 by the dry deposition method (dry plating method), metal layers 65 and 66 formed on the metal layers 62 and 64 by the wet deposition method (wet plating method), and second metal absorption layers 67 and 68 with a film thickness of 15 nm to 30 nm formed on the metal layers 65 and 66 by the dry deposition method (dry plating method).

Here, in the second laminate film illustrated in FIG. 3, the metal absorption layer 61 and the second metal absorption layer 67 are formed on both surfaces of the metal layers indicated with reference numerals 62 and 65, and the metal absorption layer 63 and the second metal absorption layer 68 are formed on both surfaces of the metal layers indicated with reference numerals 64 and 66. The reason for this is to prevent reflection of the mesh circuit pattern formed of a metal laminate thin line so that the mesh circuit pattern of the electrode substrate film fabricated using the laminate film is not visible when it is assembled in the touch panel.

Note that, in the case where the electrode substrate film is fabricated using a first laminate film which has a metal absorption layer formed on one surface of a transparent substrate formed of a resin film and a metal layer formed on the metal absorption layer, it is also possible to prevent visual recognition of the above-described circuit pattern from the transparent substrate.

(1-3) Constituent Material for Metal Absorption Layer (Metal Material)

The metal absorption layer is formed by the reactive deposition method which uses a metal material of Ni alone or an alloy containing two or more elements selected from Ni, Ti, Al, V, W, Ta, Si, Cr, Ag, Mo, and Cu, and a reactive gas containing oxygen. In addition, as the alloy described above, a Ni-based alloy is widely used which contains one or more elements selected from Ti, Al, V, W, Ta, Si, Cr, Ag, Mo, and Cu. A Ni—Cu alloy is preferable as the above-mentioned Ni-based alloy. However, the metal absorption layer turns transparent if oxidation of the metal oxide constituting the metal absorption layer proceeds to an excessive degree. It is therefore necessary to set the oxidation level to around one at which the metal absorption layer transforms into a blackened film. The reactive deposition method described above is, for example, magnetron sputtering, ion beam-sputtering, vacuum vapor deposition, ion plating, and CVD. What is more, the optical constants (refractive index and extinction coefficient) of the metal absorption layer at various wavelengths are greatly affected by the degree of reaction, i.e. the oxidation degree, and are not determined only by the metal material of the Ni-based alloy.

(1-4) Constituent Material for Metal Layer (Metal Material)

The constituent material (metal material) for the metal layer described above is not particularly limited as long as the material is a metal with a low electrical resistance value, and its examples include Cu alone or a Cu-based alloy containing one or more elements selected from Ti, Al, V, W, Ta, Si, Cr, and Ag, or Ag alone or a Ag-based alloy containing one or more elements selected from Ti, Al, V, W, Ta, Si, Cr, and Cu. Cu alone is particularly desirable in terms of the formability and resistance value of the circuit pattern.

In addition, although the film thickness of the metal layer depends on its electrical characteristics and is not determined by optical factors, the film thickness is usually set at a level where transmitted light cannot be measured.

Moreover, a desirable film thickness of the metal layer is preferably 50 nm or more, and more preferably 60 nm or more in terms of electrical resistance. On the other hand, the film thickness is preferably 5 µm (5000 nm) or less, and more preferably 3 µm (3000 nm) or less in terms of formability of processing the metal layer to form a wiring pattern.

(1-5) Resin Film Constituting Transparent Substrate

The material for the resin film applied to the laminate film described above is not particularly limited, and its specific examples include a resin film alone selected from polyethylene terephthalate (PET), polyethersulfone (PES), polyarylates (PAR), polycarbonate (PC), polyolefins (PO), triacetyl cellulose (TAC), and a resin material of norbornene, or a composite material of a resin film alone selected from the above-mentioned resin materials and an acrylic organic film covering one or both of the surfaces of this resin film alone. In particular, typical examples of the norbornene resin material include Zeonoa (trade name) manufactured by Zeon Corporation, ARTON (trade name) manufactured by JSR Corporation, and the like.

Note that since the electrode substrate film fabricated with use of the laminate film according to the present invention is used for "touch panels" and the like, it desirably has excellent transparency in the visible wavelength range, among the resin films described above.

(2) Deposition Apparatus Used for Carrying Out Reactive Deposition Method (2-1) Sputtering Web Coater The sputtering method is taken as an example of the deposition method, and its deposition apparatus is described.

Here, this deposition apparatus is referred to as a sputtering web coater and is used in a case where a surface of a long resin film being conveyed in a roll-to-roll manner is subjected to a deposition treatment continuously and efficiently.

Figure 5:
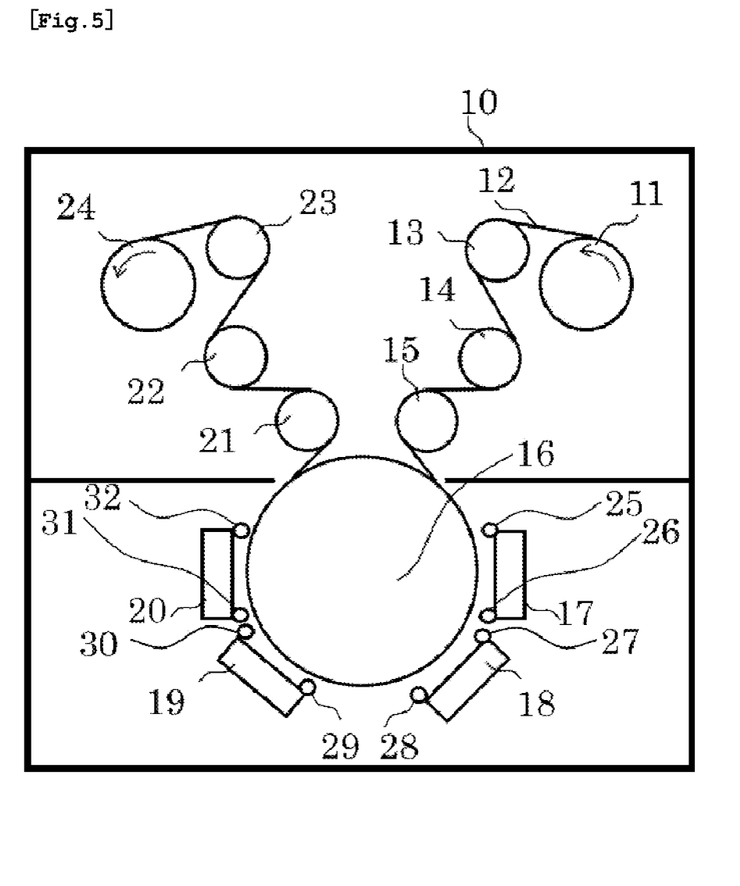
FIG. 5 is an explanatory diagram of a deposition apparatus (sputtering web coater) for carrying out a vacuum deposition method which forms the metal absorption layer and the metal layer on the transparent substrate formed of a resin film.

To be more specific, the deposition apparatus (sputtering web coater) for the long resin film conveyed in a roll-to-roll manner is provided inside a vacuum chamber 10 as illustrated in FIG. 5. The structure is such that the long resin film 12 unwound from an unwind roll 11 is subjected to a prescribed deposition treatment, and is thereafter wound by a wind roll 24. A can roll 16 rotationally driven by a motor is disposed in the middle of a conveyance path from the unwind roll 11 to the wind roll 24. Circulating inside this can roll 16 is a coolant the temperature of which is adjusted outside the vacuum chamber 10.

Inside the vacuum chamber 10, for sputter deposition, pressure is reduced to an ultimate pressure of approximately $10^{-4}$ Pa and is thereafter adjusted to approximately 0.1 to 10 Pa by introducing sputtering gas. The sputtering gas used is a known gas such as argon and is further containing a gas such as oxygen depending on the purpose. The shape and the material for the vacuum chamber 10 are not particularly limited and various options can be adopted as long as it can withstand such a reduced pressure state. In addition, the vacuum chamber 10 has various apparatuses (not illustrated) integrated thereto such as a dry pump, turbomolecular pump, and cryocoil for reducing the pressure inside vacuum chamber 10 and maintaining the reduced pressure state.

A free roll 13 which guides the long resin film 12 and a tension sensor roll 14 which measures a tension of the long resin film 12 are disposed in this order on the conveyance path from the unwind roll 11 to the can roll 16. Meanwhile, the long resin film 12 forwarded from the tension sensor roll 14 toward the can roll 16 is adjusted relative to a peripheral speed of the can roll 16 by an upstream feed roll 15 which is driven by a motor and is provided near the can roll 16. This makes it possible to bring the long resin film 12 into close contact with an outer peripheral surface of the can roll 16.

In the same manner as described above, a downstream feed roll 21 which is driven by a motor and performs adjustment relative to the peripheral speed of the can roll 16, a tension sensor roll 22 which measures the tension of the long resin film 12, and a free roll 23 which guides the long resin film 12 are disposed in this order also on the conveyance path from the can roll 16 to the wind roll 24.

At the unwind roll 11 and the wind roll 24 described above, the tension balance of the long resin film 12 is maintained through torque control by a powder clutch or the like. Additionally, the long resin film 12 is unwound from the unwind roll 11 and wound by the wind roll 24 through the rotation of the can roll 16, and the upstream feed roll 15 and the downstream feed roll 21 which are driven by motors and rotate in synchronization with the can roll 16.

Provided near the can roll 16 are magnetron sputtering cathodes 17, 18, 19, and 20 as a means of deposition at positions facing the conveyance path (i.e., a region of the outer peripheral surface of the can roll 16 around which the long resin film 12 is wound) defined on the outer peripheral surface of the can roll 16. Gas discharge pipes 25, 26, 27, 28, 29, 30, 31, and 32 which discharge reactive gas are installed in this vicinity.

Meanwhile, when sputter deposition is to be carried out for the above-described metal absorption layer and the metal layer, a plate-shaped target can be used as illustrated in FIG. 5. In the case where a plate-shaped target is used, however, a nodule (growth of an unwanted matter) may be produced on the target. In a case where this gives rise to a problem, it is preferable to use a cylindrical rotary target, with which nodules are not produced and the usage efficiency of the target is high.

(2-2) Reactive Sputtering

Using an oxide target for the purpose of depositing a metal absorption layer made of metal oxide is not suitable for mass production because the deposition rate is slow. For this reason, a metal target (metal material) of a Ni-based alloy or the like is employed which enables fast deposition, and a reactive deposition method, such as reactive sputtering, is adopted in which a reactive gas containing oxygen is controlled when being introduced.

Below are four known methods of controlling the reactive gas:

(2-2-1) a method of discharging reactive gas at a constant flow rate.

(2-2-2) a method of discharging reactive gas so as to maintain a constant pressure.

(2-2-3) a method of discharging reactive gas such that the impedances of the sputtering cathodes are constant (impedance control).

(2-2-4) a method of discharging reactive gas such that the sputtering plasma intensity is constant (plasma emission control).

(3) Deposition of Metal Absorption Layer

The laminate film used in the fabrication of the electrode substrate film is required to have such characteristics that the layered film (metal absorption layer and metal layer) is easily etched by an etching liquid such as an aqueous solution of copper(II) chloride or an aqueous solution of ferric chloride, and that the circuit pattern of electrodes and the like formed by etching processing is less visible under highly bright illumination.

In the deposition of the above-described metal absorption layer by, for example, reactive sputtering, a metal absorption layer as a black film can be obtained by supplying argon, the sputtering gas, with oxygen to produce a reactive gas.

Examination of the etching quality of the layered film (metal absorption layer and metal layer) in the laminate film shows that it is easy to etch the metal layer of copper or the like, but it is difficult to etch the metal absorption layer, as described earlier. For this reason, it is necessary to improve the etching quality of the metal absorption layer in order to improve the etching quality of the laminate film.

For the laminate film which is obtained by performing continuous sputtering deposition on the long resin film with use of the deposition apparatus in FIG. 5, it was found that the rate of etching with an etching liquid differed in a longitudinal direction of the long resin film, and that the etching rate for the laminate film on the earlier-deposited end side (region of the long laminate film on the earlier-deposited end side) was faster than that of the laminate film on the later-deposited end side (region of the long laminate film on the later-deposited end side), and this symptom led to a deduction that this was because the etching rate of the metal absorption layer was different as described above.

Figure 7:
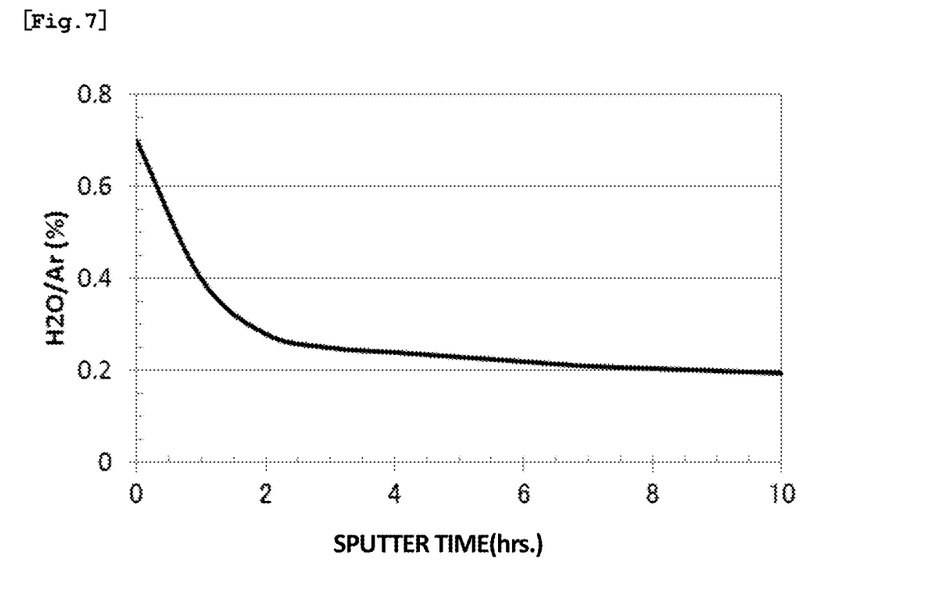
FIG. 7 is a graph diagram illustrating a change over time in the amount of water in a vacuum chamber.

On the other hand, regarding the vacuum deposition apparatus which performs continuous sputtering deposition on the long resin film, a decrease over time in the amount of water contained in the vacuum chamber was observed using a quadrupole mass analyzer or the like (see the graph diagram of FIG. 7).

Moreover, Non-Patent Document 1 describes that the chemical composition (chemical state of Ni) of the metal oxide (metal absorption layer) deposited by reactive sputtering which uses the Ni-based target mentioned above is a NiO film when oxygen is introduced, and a NiOOH film when water is introduced as the reactive gas, as described above.

In the course of repeating manufacturing and testing prototype laminate films, the present inventor deduced that the above-described metal oxide (metal absorption layer) had fine crystal grains and the presence of hydroxide NiOOH mentioned above affected the etching quality. Furthermore, the present inventor deduced that the presence of a hydroxide affected the etching quality also in the case of a metal oxide (metal absorption layer) formed by employing an alloy target containing two or more elements selected from Ti, Al, V, W, Ta, Si, Cr, Ag, Mo, and Cu, instead of the Ni-based target described above.

With the above taken into consideration, the present inventor supplied hydrogen into the reactive gas to compensate for the decreasing amount of water in the vacuum chamber during deposition, which solved the problem that the etching rate differed depending on a position in the longitudinal direction of the long resin film.

In the vacuum chamber, water molecules are cleaved into hydrogen and oxygen by sputtering plasma. For this reason, the supplying of hydrogen into the reactive gas is expected to have the same effect as the addition of water. This is because the hydrogen supplied into the reactive gas is taken in the metal absorption layer.

Furthermore, when hydrogen gas is used, it is possible to avoid an unfavorable condition where vapor obtained after vaporization returns to water, compared to the case of introducing water into the vacuum chamber. What is more, examples of the method of introducing water into the vacuum chamber include a bubbling method which allows the carrier gas to pass underwater and a direct vaporization method which heats and vaporizes water. However, these methods are difficult to conduct because they involve a complicated mechanism and the vapor returns to water when cooled down. Hydrogen, in contrast, is easy to deal with thanks to its gaseous nature.

In addition, when mixed at less than 4% in the carrier gas (e.g., argon), hydrogen is highly safe to deal with.

The added amount of hydrogen may be determined so as to compensate for the decrease over time in the amount of water contained in the vacuum chamber, as described above. The amount of water contained in the vacuum chamber varies depending on the position where the quadrupole mass analyzer is disposed in the vacuum chamber, the shape of the vacuum chamber, and the like. Thus, the added amount of hydrogen may be set as appropriate for each deposition apparatus.

Note that although it is preferable to employ a method of supplying hydrogen into the reactive gas as a method of supplementing the amount of water in the vacuum chamber, the same effect is obtained when water is added instead of hydrogen.

Incidentally, the water in the vacuum chamber measured by the quadrupole mass analyzer or the like is water adsorbed in the vacuum chamber during exposure to the air when, for example, the laminate film after deposition is taken out of the vacuum deposition apparatus.

(4) Introduction of Reactive Gas in Deposition Apparatus

In the deposition of the metal absorption layer by reactive sputtering or the like, oxygen is added to argon to create the reactive gas being the sputtering atmosphere. When oxygen is added, a NiO film (not completely oxidized) or the like can be formed by reactive sputtering or the like which uses, for example, a Ni-based metal target (metal material). The amount of oxygen contained in the reactive gas depends on the types of deposition apparatus and the metal target (metal material) and may be set as appropriate in consideration of the optical characteristics of the metal absorption layer such as reflectance and the etching quality by an etching liquid. It is desirable that the amount of oxygen be set to 15% by volume or less.

Here, FIG. 7 illustrates the change in the amount of residual water in the vacuum chamber after sputtering is started, where no hydrogen gas or water is supplied to the vacuum chamber. The graph shows that the residual water decreases as the sputtering deposition time passes. It is considered that the reason for the fast rate of decrease in water immediately after the start of sputtering is that more water molecules, adsorbed in the vacuum chamber, tend to be eliminated by plasma and heat generated during sputtering.

Figure 6:
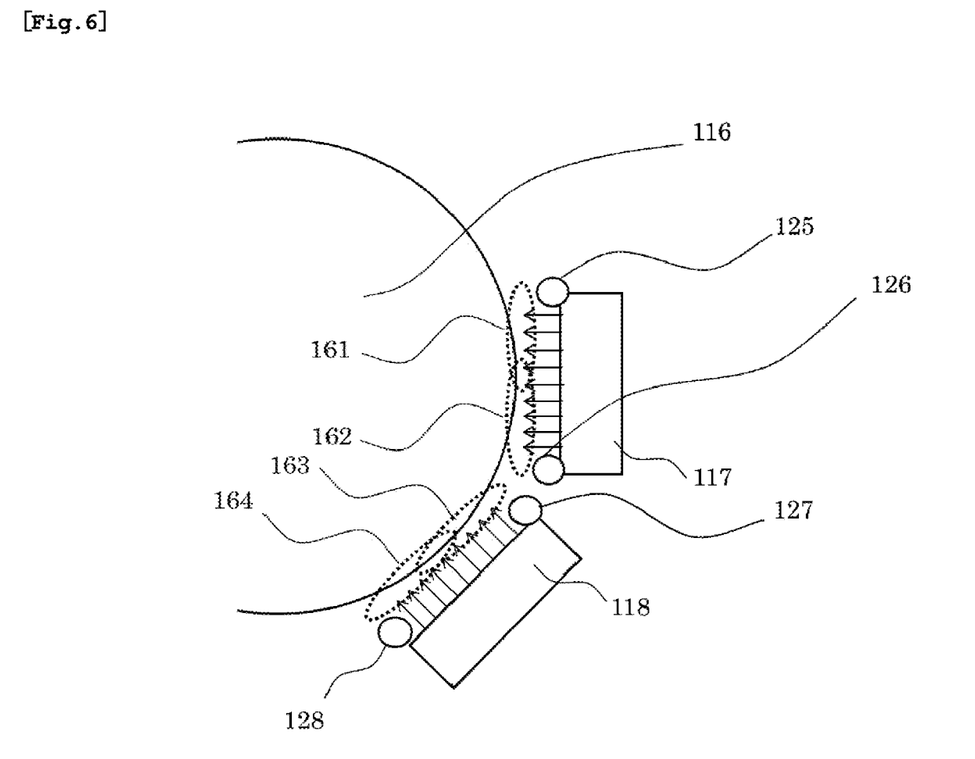
FIG. 6 is a partially enlarged diagram of the deposition apparatus (sputtering web coater) illustrated in FIG. 5.

Next, FIG. 6 illustrates an enlarged diagram of a region near the sputtering cathodes 17 and 18 in the deposition apparatus of FIG. 5.

In the case where two sputtering cathodes are used to deposit the metal absorption layer being the first layer counted from the transparent substrate, it is possible to introduce the reactive gas through four gas discharge pipes 125, 126, 127, and 128, which discharge the reactive gas to near the sputtering cathodes.

When a Ni-based metal target (metal material) is used, for example, etching proceeds in the order of decreasing rate Ni-film, NiOOH film, and NiO film as described above, although the rate depends on the etching liquid. If priority is given to the etching quality, it is desirable that the metal absorption layer on the resin film side in a thickness direction be a NiOOH film (not completely oxidized). Conversely, if priority is given to barrier property in which water from the resin film does not oxidize the layered film, it is desirable that the metal absorption layer on the resin film side in a thickness direction be a NiO film (not completely oxidized).

For the purpose of distributing the constituent components in the thickness direction of the metal absorption layer, it suffices to select the reactive gas to be introduced through the four gas discharge pipes 125, 126, 127, and 128 and to obtain gas atmospheres 161, 162, 163, and 164 near the gas discharge pipes. For example, when hydrogen is introduced through the gas discharge pipe 125, a NiOOH film is more likely to be formed on the resin film side in the thickness direction of the metal absorption layer. When hydrogen is introduced through the gas discharge pipe 128, a NiO film is more likely to be formed on the resin film side in the thickness direction of the metal absorption layer.

(5) Electrode Substrate Film (5-1) It is possible to obtain the electrode substrate film according to the present invention by etching the layered film of the laminate film according to the present invention and processing the layered film to form a metal laminate thin line with a line width of 20 µm or less. To be more specific, the electrode substrate film as illustrated in FIG. 4 can be obtained by etching the layered film of the laminate film illustrated in FIG. 3.

Figure 4:
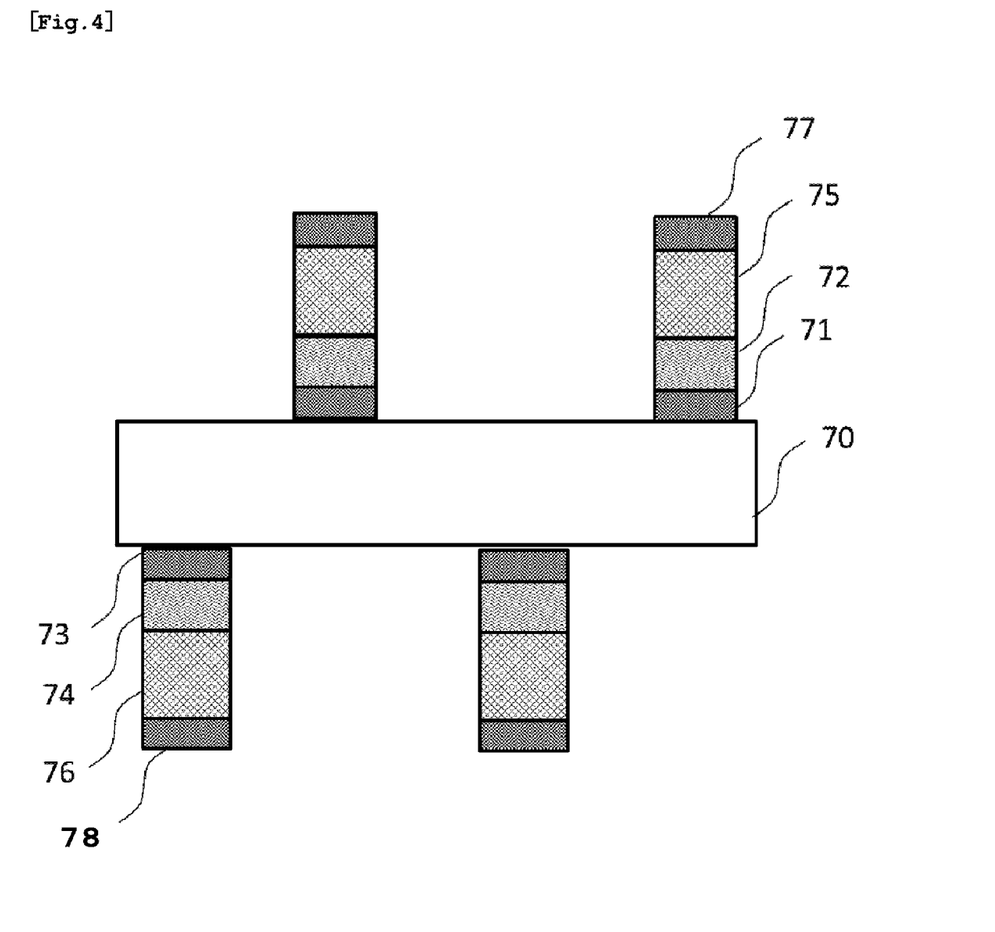
FIG. 4 is a schematic explanatory diagram of a cross-section of an electrode substrate film according to the present invention which includes metal laminate thin lines on both surfaces of the transparent substrate formed of a resin film.

Specifically, the electrode substrate film as illustrated in FIG. 4 includes a transparent substrate 70 formed of a resin film and a mesh circuit pattern provided on both surfaces of the transparent substrate 70 and formed of metal laminate thin lines. The metal laminate thin lines have a line width of 20 µm or less and include metal absorption layers 71 and 73 as first layers, metal layers 72, 75, 74, and 76 as second layers, and second metal absorption layers 77 and 78 as third layers, counted from the transparent substrate 70 side.

In addition, an electrode (wiring) pattern of the electrode substrate film is formed into a stripe shape or a grid shape for a touch panel. Thereby, the electrode substrate film according to the present invention can be used for a touch panel. Moreover, the metal laminate thin line formed into the electrode (wiring) pattern maintains a laminate structure of the laminate film. As a result, it is possible to provide an electrode substrate film in which the circuit pattern of electrodes and the like provided on the transparent substrate is much less visible even under highly bright illumination.

(5-2) Furthermore, for forming the laminate film according to the present invention into an electrode substrate film, a known subtractive method can be used.

The subtractive method is a method of creating a wiring pattern by forming a photoresist film on the surface of the layered film of the laminate film, performing exposure and development so that the photoresist film remains at an area where the wiring pattern is wished to be created, and removing, by chemical etching, the layered film at an area without the photoresist film on the surface of the layered film described above.

An aqueous solution of ferric chloride and an aqueous solution of copper(II) chloride can be used as an etching liquid for the chemical etching mentioned above.

EXAMPLES

Hereinbelow, examples of the present invention are described in detail with reference to a comparative example. Note that the present invention is not limited to the examples to be described later.

Examples 1 to 5

The deposition apparatus (sputtering web coater) illustrated in FIG. 5 is used and oxygen gas is used as the reactive gas. In addition, the can roll 16 is made of stainless steel with a diameter of 600 mm and a width of 750 mm, and a surface of the roll is plated with hard chrome. Each of the upstream feed roll 15 and the downstream feed roll 21 is made of stainless steel with a diameter of 150 mm and a width of 750 mm, and a surface of each roll is plated with hard chrome. Besides, the gas discharge pipes 25, 26, 27, 28, 29, 30, 31, and 32 were installed on the upstream side and the downstream side of the magnetron sputtering cathodes 17, 18, 19, and 20. Moreover, a Ni—Cu target for the metal absorption layer was attached to the magnetron sputtering cathodes 17 and 18, and a Cu target for the metal layer to the magnetron sputtering cathodes 19 and 20.

Note that the magnetron sputtering cathodes 17 and 18 of FIG. 5 correspond to the magnetron sputtering cathodes 117 and 118 in FIG. 6, and the gas discharge pipes 25, 26, 27, and 28 of FIG. 5 correspond to the gas discharge pipes 125, 126, 127, and 128 in FIG. 6.

In addition, a PET film with a width of 600 mm and a length of 1200 m was used for the resin film constituting the transparent substrate, and the temperature of the can roll 16 was controlled and cooled to be at 0° C. What is more, the vacuum chamber 10 was evacuated to 5 Pa by using multiple dry pumps, and was further evacuated to $3\times10^3$ Pa using multiple turbomolecular pumps and cryocoils.

Thereafter, the conveyance speed of the resin film was set to 2 m/min. After that, 500 sccm of argon gas was introduced through the gas discharge pipes 29, 30, 31, and 32 described above, and deposition was carried out under such power control for the cathodes 19 and 20 that a Cu film thickness of 80 nm could be obtained. On the other hand, for the metal absorption layer, a gas mixture of 500 sccm of argon gas and 50 sccm of oxygen gas mixed together was introduced through the gas discharge pipes 25, 26, 27, and 28 illustrated in FIG. 5 (gas discharge pipes 125, 126, 127, and 128 in FIG. 6). For the cathodes 17 and 18 illustrated in FIG. 5 (magnetron sputtering cathodes 117 and 118 in FIG. 6), deposition was carried out under such power control that a Ni—Cu oxidized film thickness of 30 nm could be obtained.

Here, FIG. 7 illustrates the change in the residual water in the vacuum chamber, which was measured in advance with a quadrupole mass analyzer (manufactured by ULVAC, Inc.). In order to keep a constant amount of residual water in the vacuum chamber, it suffices to increase the flow rate of hydrogen and oxygen in a ratio of 2:1 in a mole ratio with passage of sputter time so that the ratio of water to argon is the same as 0.7% (see the graph diagram of FIG. 7), which is the value at the start of sputtering. It is desirable to use argon, a sputtering gas, as the carrier gas for each gas. A certain offset amount may be set for the amount of hydrogen to be supplied into the reactive gas in consideration of the reflectance and the etching quality of the metal absorption layer to be deposited.

Additionally, the hydrogen to be supplied into the reactive gas was introduced through the gas discharge pipes listed in Table 1 below.

First, in Example 1, hydrogen was introduced only through the gas discharge pipe 125 located on the upstream side of the magnetron sputtering first cathode 117. Hydrogen was not introduced through the gas discharge pipe 126 located on the downstream side of the magnetron sputtering first cathode 117 or the gas discharge pipes 127 and 128 of the magnetron sputtering second cathode 118.

In Example 2, hydrogen was introduced through the gas discharge pipes 125 and 126 of the magnetron sputtering first cathode 117. Hydrogen was not introduced through the gas discharge pipes 127 and 128 of the magnetron sputtering second cathode 118.

In Example 3, hydrogen was introduced through the gas discharge pipe 125 located on the upstream side of the magnetron sputtering first cathode 117 and the gas discharge pipe 127 located on the upstream side of the magnetron sputtering second cathode 118. Hydrogen was not introduced through the gas discharge pipe 126 located on the downstream side of the magnetron sputtering first cathode 117 or the gas discharge pipe 128 located on the downstream side of the magnetron sputtering second cathode 118.

In Example 4, hydrogen was introduced through the gas discharge pipes 127 and 128 of the magnetron sputtering second cathode 118. Hydrogen was not introduced through the gas discharge pipes 125 and 126 of the magnetron sputtering first cathode 117.

In Example 5, hydrogen was introduced only through the discharge pipe 128 located on the downstream side of the magnetron sputtering second cathode 118. Hydrogen was not introduced through the gas discharge pipes 125 and 126 of the magnetron sputtering first cathode 117 or the gas discharge pipe 127 located on the upstream side of the magnetron sputtering second cathode 118.

Note that since the deposition rate at the metal absorption layer is expected to decrease depending on the amount of hydrogen and oxygen introduced through the gas discharge pipes, the sputtering power needs to be adjusted in order to obtain the target film thickness of the metal absorption layer. Incidentally, a gas mixture of $H_2$ and $O_2$ may be allowed to flow through one gas discharge pipe. It is to be noted that the magnetron sputtering first cathode 117 and the magnetron sputtering second cathode 118 of the deposition apparatus applied to Examples and the like are not in differential operation to discharge gases, and the gas atmospheres 161, 162, 163, and 164 illustrated in FIG. 6 are not independent of one another.

Laminate films of Examples 1 to 5 were manufactured, each of which included a transparent substrate formed of a long PET film and a layered film which was formed of a metal absorption layer being a Ni—Cu oxidized film and a metal layer being a Cu film, and was provided on the transparent substrate.

Comparative Example 1

The comparative example was manufactured in almost the same manner as in Examples except that the reactive gas did not contain hydrogen.

To be more specific, a laminate film of Comparative Example 1 was manufactured in almost the same manner as in Examples except that hydrogen was not introduced through the gas discharge pipes 125 and 126 of the magnetron sputtering first cathode 117 or the gas discharge pipes 127 and 128 of the magnetron sputtering second cathode 118, the laminate film including a transparent substrate formed of a long PET film and a layered film which was formed of a metal absorption layer being a Ni—Cu oxidized film and a metal layer being a Cu film, and was provided on the transparent substrate.

TABLE 1

| | Type of gases introduced | | | |
|---|---|---|---|---|
| | Cathode | | | |
| | First cathode (117) | | Second cathode (118) | |
| | Gas discharge pipe | | | |
| | Upstream side (125) | Downstream side (126) | Upstream side (127) | Downstream side (128) |
| Example 1 | Ar + $H_2$ | Ar + $O_2$ | Ar + $O_2$ | Ar + $O_2$ |
| Example 2 | Ar + $H_2$ | Ar + $H_2$ | Ar + $O_2$ | Ar + $O_2$ |
| Example 3 | Ar + $H_2$ | Ar + $O_2$ | Ar + $H_2$ | Ar + $O_2$ |
| Example 4 | Ar + $O_2$ | Ar + $O_2$ | Ar + $H_2$ | Ar + $H_2$ |
| Example 5 | Ar + $O_2$ | Ar + $O_2$ | Ar + $O_2$ | Ar + $H_2$ |
| Comparative Example 1 | Ar + $O_2$ | Ar + $O_2$ | Ar + $O_2$ | Ar + $O_2$ |

[Evaluation Test]

(1) Each of the laminate films (laminate films which include a layered film formed of a metal absorption layer as a first layer and a copper layer as a second layer, counted from the transparent substrate side) according to Examples 1 to 5 and Comparative Example 1 was sampled at intervals of 100 m from 0 m to 1100 m, and the spectral reflectance property and the etching quality of each laminate film was evaluated.

(2) Regarding the spectral reflectance property of the laminate films, the spectral reflectance property of the metal absorption layer as the first layer was measured through the transparent substrate with a self-recording spectrophotometer.

(3) Regarding the etching quality of the laminate films, the above-described layered film (metal absorption layer and copper layer) was chemically etched using an aqueous solution of ferric chloride as the etching liquid.

The etching quality evaluation described above was conducted with grade marks (Excellent, Good, Poor, Bad) assigned in accordance with the following criteria:

"Excellent": Etching residues cannot be observed visually or with an optical microscope.

"Good": Etching residues cannot be observed visually. Can be put in practical use.

"Poor": Etching residues can be partially observed visually.

"Bad": Etching residues can be observed visually over a wide area.

(4) The evaluation results are shown in Table 2 and Table 3 below.

TABLE 2

| Gas discharge pattern | Evaluation item | Sampling position (m) | | | | | |
|---|---|---|---|---|---|---|---|
| | | 0 | 100 | 200 | 300 | 400 | 500 |
| Example 1 | Reflectance (%) | 24 | 23 | 23 | 23 | 23 | 23 |
| | Etching quality | Good | Excellent | Excellent | Excellent | Excellent | Excellent |
| Example 2 | Reflectance (%) | 24 | 26 | 26 | 26 | 26 | 26 |
| | Etching quality | Good | Excellent | Excellent | Excellent | Excellent | Excellent |
| Example 3 | Reflectance (%) | 24 | 24 | 24 | 24 | 24 | 24 |
| | Etching quality | Good | Excellent | Excellent | Excellent | Excellent | Excellent |
| Example 4 | Reflectance (%) | 24 | 22 | 22 | 22 | 22 | 22 |
| | Etching quality | Good | Good | Good | Good | Good | Good |
| Example 5 | Reflectance (%) | 24 | 21 | 21 | 21 | 21 | 21 |
| | Etching quality | Good | Good | Good | Good | Good | Good |
| Comparative Example 1 | Reflectance (%) | 24 | 23 | 23 | 23 | 23 | 23 |
| | Etching quality | Good | Good | Poor | Poor | Bad | Bad |

TABLE 3

| Gas discharge pattern | Evaluation item | Sampling position (m) | | | | | |
|---|---|---|---|---|---|---|---|
| | | 600 | 700 | 800 | 900 | 1000 | 1100 |
| Example 1 | Reflectance (%) | 23 | 23 | 23 | 23 | 23 | 23 |
| | Etching quality | Excellent | Excellent | Excellent | Excellent | Excellent | Excellent |
| Example 2 | Reflectance (%) | 26 | 26 | 26 | 26 | 26 | 26 |
| | Etching quality | Excellent | Excellent | Excellent | Excellent | Excellent | Excellent |
| Example 3 | Reflectance (%) | 24 | 24 | 24 | 24 | 24 | 24 |
| | Etching quality | Good | Excellent | Excellent | Excellent | Excellent | Excellent |
| Example 4 | Reflectance (%) | 22 | 22 | 22 | 22 | 22 | 22 |
| | Etching quality | Good | Good | Good | Good | Good | Good |
| Example 5 | Reflectance (%) | 21 | 21 | 21 | 21 | 21 | 21 |
| | Etching quality | Good | Good | Good | Good | Good | Good |
| Comparative Example 1 | Reflectance (%) | 23 | 23 | 23 | 23 | 23 | 23 |
| | Etching quality | Bad | Bad | Bad | Bad | Bad | Bad |

[Confirmation]

(1) The grade marks in the "Etching quality" entries of Table 2 and Table 3 show that the conventional problem that the etching quality of the laminate film on the later-deposited end side is inferior to the laminate film on the earlier-deposited end side is solved for the laminate films of Examples 1 to 5, the metal absorption layer of which was deposited while supplying hydrogen into the reactive gas and compensating for the decrease in the amount of water in the vacuum chamber.

(2) The tables show that the laminate films of Examples 1 to 3, where hydrogen is introduced through the gas discharge pipes 125 and 126 of the magnetron sputtering first cathode 117 the deposition region of which is located on the upstream side of the magnetron sputtering second cathode 118, exhibit better etching quality than the laminate films of Examples 4 to 5, where hydrogen is introduced through the gas discharge pipes 127 and 128 of the magnetron sputtering second cathode 118.

The inventor deduces that such a difference arises because more NiOOH film, which are easily etched, is contained in the metal absorption layer on the transparent substrate side in the thickness direction in the laminate films of Examples 1 to 3.

(3) On the other hand, the tables show that the laminate films of Examples 1 to 3, where hydrogen is introduced through the gas discharge pipes 125 and 126 of the magnetron sputtering first cathode 117, have a little higher reflectance than the laminate films of Examples 4 to 5, where hydrogen is introduced through the gas discharge pipes 127 and 128 of the magnetron sputtering second cathode 118.

(4) Additionally, the tables show that since water discharged from the vacuum chamber has a large effect immediately after the start of deposition (near the sampling position of 0 m), the etching quality is not stable in the laminate films according to Examples 1 to 5 and Comparative Example 1.

(5) A laminate film was manufactured in which a second metal absorption layer as a third layer, counted from the transparent substrate side, was deposited on the copper layer described above, and the etching quality of the second metal absorption layer was evaluated, which showed a relatively good result. This is probably because that the copper layer as a second layer, counted from the transparent substrate, was present.

POSSIBILITY OF INDUSTRIAL APPLICATION

A laminate film and an electrode substrate film according to the present invention are industrially applicable to a "touch panel" installed on a surface of an FPD (flat panel display) because the laminate film is excellent in etching quality, and electrodes and the like of the electrode substrate film which is fabricated using the laminate film are less visible even under highly bright illumination.

REFERENCE SIGNS LIST 10 vacuum chamber
11 unwind roll
12 long resin film
13 free roll
14 tension sensor roll
15 upstream feed roll
16 can roll
17 magnetron sputtering cathode
18 magnetron sputtering cathode
19 magnetron sputtering cathode
20 magnetron sputtering cathode
21 downstream feed roll
22 tension sensor roll
23 free roll
24 wind roll
25 gas discharge pipe
26 gas discharge pipe
27 gas discharge pipe
28 gas discharge pipe
29 gas discharge pipe
30 gas discharge pipe
31 gas discharge pipe
32 gas discharge pipe
40 resin film (transparent substrate)
41 metal absorption layer
42 metal layer (copper layer)
43 metal absorption layer
44 metal layer (copper layer)
50 resin film (transparent substrate)
51 metal absorption layer
52 metal layer (copper layer) formed by dry deposition method
53 metal absorption layer
54 metal layer (copper layer) formed by dry deposition method
55 metal layer (copper layer) formed by wet deposition method
56 metal layer (copper layer) formed by wet deposition method
60 resin film (transparent substrate)
61 metal absorption layer
62 metal layer (copper layer) formed by dry deposition method
63 metal absorption layer
64 metal layer (copper layer) formed by dry deposition method
65 metal layer (copper layer) formed by wet deposition method
66 metal layer (copper layer) formed by wet deposition method
67 second metal absorption layer
68 second metal absorption layer
70 resin film (transparent substrate)
71 metal absorption layer
72 metal layer (copper layer) formed by dry deposition method
73 metal absorption layer
74 metal layer (copper layer) formed by dry deposition method
75 metal layer (copper layer) formed by wet deposition method
76 metal layer (copper layer) formed by wet deposition method
77 second metal absorption layer
78 second metal absorption layer
116 can roll
117 magnetron sputtering first cathode
118 magnetron sputtering second cathode
125 gas discharge pipe
126 gas discharge pipe
127 gas discharge pipe
128 gas discharge pipe
161 gas atmosphere
162 gas atmosphere
163 gas atmosphere
164 gas atmosphere

The invention claimed is:

1. A method of manufacturing by a sputtering method a laminate film which includes a transparent substrate formed of a resin film and a layered film provided on at least one surface of the transparent substrate, characterized in that the method comprises:
   an examination step of examining a relationship between a change over time of an amount of water in a vacuum chamber, that is, a sputter time (hrs.) and an amount of residual water in the vacuum chamber by, after sputtering is started where no hydrogen gas or water is supplied to the vacuum chamber, measuring the amount of water in the vacuum chamber with a quadrupole mass analyzer; and
   a deposition step of forming a layered film on at least one surface of the transparent substrate,
   the deposition step including
   a first step of forming a metal absorption layer as a first layer, counted from the transparent substrate side of the layered film, by a reactive sputtering method which uses a metal material made of Ni alone or an alloy containing two or more elements selected from Ni, Ti, Al, V, W, Ta, Si, Cr, Ag, Mo, and Cu, and a reactive gas containing oxygen; and
   a second step of forming a metal layer as a second layer, counted from the transparent substrate side of the layered film, by a sputtering method which uses a metal material, and
   the reactive gas in the first step contains hydrogen in a ratio of hydrogen to oxygen of 2:1 in a mole ratio,
   wherein the amount of hydrogen contained in the reactive gas is set to an amount which compensates for a decrease in the amount of residual water in the vacuum chamber examined in the examination step, that is, a difference between the amount of water in the vacuum chamber immediately after the sputtering is started and the amount of residual water.

2. The method of manufacturing a laminate film according to claim 1, characterized in that the method further comprises
   a third step of forming a second metal absorption layer as a third layer, counted from the transparent substrate side of the layered film, by the reactive sputtering method which uses a metal material made of Ni alone or an alloy containing two or more elements selected from Ni, Ti, Al, V, W, Ta, Si, Cr, Ag, Mo, and Cu, and a reactive gas containing oxygen, and
   the reactive gas in the third step contains hydrogen in a ratio of hydrogen to oxygen of 2:1 in a mole ratio,
   wherein the amount of hydrogen contained in the reactive gas is set to an amount which compensates for a decrease in the amount of residual water in the vacuum chamber examined in the examination step, that is, a difference between the amount of water in the vacuum chamber immediately after the sputtering is started and the amount of residual water.

3. The method of manufacturing a laminate film according to claim 2, characterized in that
   the alloy includes a Ni-based alloy containing one or more elements selected from Ti, Al, V, W, Ta, Si, Cr, Ag, Mo, and Cu.

4. The method of manufacturing a laminate film according to claim 2, characterized in that
   the hydrogen contained in the reactive gas is introduced into a deposition chamber such that a hydrogen concentration is high on the transparent substrate side of the second metal absorption layer formed in the third step.

5. The method of manufacturing a laminate film according to claim 1, characterized in that the alloy includes a Ni-based alloy containing one or more elements selected from Ti, Al, V, W, Ta, Si, Cr, Ag, Mo, and Cu.

6. The method of manufacturing a laminate film according to claim 1, characterized in that
   the hydrogen contained in the reactive gas is introduced into a deposition chamber such that a hydrogen concentration is high on the transparent substrate side of the metal absorption layer formed in the first step.

7. A method of manufacturing an electrode substrate film including a transparent substrate formed of a resin film and a mesh circuit pattern provided on at least one surface of the transparent substrate and formed of a metal laminate thin line, characterized in that the method comprises
   performing chemical etching on the layered film of the laminate film manufactured by the method of manufacturing a laminate film according to claim 1 to form the metal laminate thin line with a line width of 20 µm or less.

8. A method of manufacturing an electrode substrate film including a transparent substrate formed of a resin film and a mesh circuit pattern provided on at least one surface of the transparent substrate and formed of a metal laminate thin line, characterized in that the method comprises
   performing chemical etching on the layered film of the laminate film manufactured by the method of manufacturing a laminate film according to claim 5 to form the metal laminate thin line with a line width of 20 µm or less.

9. A method of manufacturing an electrode substrate film including a transparent substrate formed of a resin film and a mesh circuit pattern provided on at least one surface of the transparent substrate and formed of a metal laminate thin line, characterized in that the method comprises
   performing chemical etching on the layered film of the laminate film manufactured by the method of manufacturing a laminate film according to claim 2 to form the metal laminate thin line with a line width of 20 µm or less.

10. A method of manufacturing an electrode substrate film including a transparent substrate formed of a resin film and a mesh circuit pattern provided on at least one surface of the transparent substrate and formed of a metal laminate thin line, characterized in that the method comprises
    performing chemical etching on the layered film of the laminate film manufactured by the method of manufacturing a laminate film according to claim 3 to form the metal laminate thin line with a line width of 20 µm or less.

* * * * *